United States Patent
Kim

(10) Patent No.: US 8,115,533 B2
(45) Date of Patent: Feb. 14, 2012

(54) VOLTAGE LEVEL SHIFTER AND SEMICONDUCTOR DEVICE HAVING THE SAME THEREIN

(75) Inventor: Saeng Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/647,776

(22) Filed: Dec. 28, 2009

(65) Prior Publication Data
US 2010/0301818 A1 Dec. 2, 2010

(30) Foreign Application Priority Data
May 28, 2009 (KR) .................. 10-2009-0047152

(51) Int. Cl.
*H03L 5/00* (2006.01)
(52) U.S. Cl. .................. 327/333; 326/62; 326/81
(58) Field of Classification Search .......... 326/62–63, 326/80–81; 327/306, 333
See application file for complete search history.

(56) References Cited

U.S. PATENT DOCUMENTS

| | | | |
|---|---|---|---|
| 6,501,321 B2 * | 12/2002 | Kumagai | 327/333 |
| 6,566,930 B1 * | 5/2003 | Sato | 327/333 |
| 6,768,368 B2 * | 7/2004 | Kaneko et al. | 327/333 |
| 7,085,177 B2 | 8/2006 | Savage | |
| 7,158,404 B2 * | 1/2007 | Lai | 365/154 |
| 7,521,628 B2 * | 4/2009 | Armstrong-Muntner | 84/737 |
| 7,564,264 B1 * | 7/2009 | Morrison et al. | 326/68 |
| 7,881,756 B2 * | 2/2011 | Park et al. | 455/574 |
| 2005/0083103 A1 * | 4/2005 | Ahsanullah et al. | 327/333 |

FOREIGN PATENT DOCUMENTS
KR 10-0476453 B1 3/2005
* cited by examiner

*Primary Examiner* — Dinh T. Le
(74) *Attorney, Agent, or Firm* — Ladas & Parry LLP

(57) ABSTRACT

A voltage level shifter and a semiconductor device having the same are presented. The voltage level shifter includes a swing width transformer and a power supply controller. The swing width transformer receives an input signal that ranges between a first level power voltage and a ground voltage and is configured to generate a signal that ranges between a second level power voltage and that of the ground voltage. The power supply controller is configured to control power supply to the swing width transformer in response to an enable signal activated in an active mode.

1 Claim, 3 Drawing Sheets

VOLTAGE LEVEL SHIFTER AND SEMICONDUCTOR DEVICE HAVING THE SAME THEREIN

CROSS-REFERENCES TO RELATED PATENT APPLICATION

The present application claims priority to Korean application number 10-2009-0047152, filed on May 28, 2009, which is incorporated by reference in its entirety.

TECHNICAL FIELD

This disclosure relates to a level shifter capable of reducing leakage current.

BACKGROUND

In semiconductor devices, level shifters are generally used to interface voltage signals between diversely different circuits that operate at different power voltages from each other. For example, a word line driver of a semiconductor device may operate at a high voltage which is higher than an external voltage applied to the semiconductor device. As such, a signal for operating the word line driver may function in a voltage swing range between the external voltage and the ground voltage, and in contrast, the word line driver may need to function at a considerably different voltage swing range between the high voltage and the ground voltage. As a result, if a circuit generating a signal for operating the word line driver, which uses the external voltage lower than the high voltage, is directly coupled to the word line driver, then a leakage current may flow from the word line driver of the high voltage into the circuit of the external voltage. Therefore, level shifters are often times found to be desirable or even deemed necessary for interfacing voltage signals between the two divergent circuits that are different each other with regards to power voltage level requirements.

FIG. 1 shows a circuit of a general level shifter employed in a semiconductor device.

As shown in FIG. 1, the level shifter receives an input signal IN that is at a relatively low voltage, and subsequently generates an output signal OUT that is at a relatively high voltage. An operation of the level shifter is as follows.

First, the case that the input signal IN drops down to the ground voltage VSS from a level V1 will be explained. When the input signal IN is set at a voltage level V1, the output signal OUT is generated at a voltage level V2 as NMOS and PMOS transistors N10 and P11 are turned on by the input signal IN. From this state, if the input signal IN drops down to the ground voltage VSS, an NMOS transistor N11 is turned on. The turn-on state of the PMOS transistor P11 is maintained until a PMOS transistor P10 is turned on to be pulled-up. That is, while the input signal IN is transitioning toward the ground voltage VSS from the voltage level V1, there is a time period in which the NMOS transistor N11 and the PMOS transistor P11 are both turned on concurrently. To prevent this effect, the NMOS transistor N10 is usually designed to be larger in size to enhance a turn-off rate of the PMOS transistor P11.

However, as the level shifter shown in FIG. 1 is being turned on at all times, regardless of whatever the semiconductor device is conditioned in an active mode or a standby mode, a leakage current necessarily continuously flows through the level shifter.

SUMMARY

There is provided a level shifter capable of reducing a leakage current in a standby mode by interrupting power thereto or controlling a voltage level of an internal node thereof.

In one embodiment, a level shifter may include a swing width transformer configured to receive an input signal that ranges between a first level and a ground voltage and to generate a signal that ranges between a second level and the ground voltage, and a power supply controller configured to control power supply to the swing width transformer in response to an enable signal active in an active mode.

In another embodiment, a level shifter may include a swing width transformer configured to receive an input signal ranging between a first level and a ground voltage and generating a signal ranging between a second level and the ground voltage, and a power supply controller configured to control a voltage level of an internal node of the swing width transformer in response to an enable signal activated in an active mode.

In another embodiment, a semiconductor device may include an enable signal generator configured to generate an enable signal activated in an active mode and an inverted enable signal activated in a standby mode, a first level shifter configured to be controlled by the inverted enable signal in power supply and to generate a first output signal by transforming a first input signal in voltage level, and a second level shifter configured to have an internal node, which is controlled by the enable signal in voltage level, and to generate a second output signal by transforming a second input signal in voltage level.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
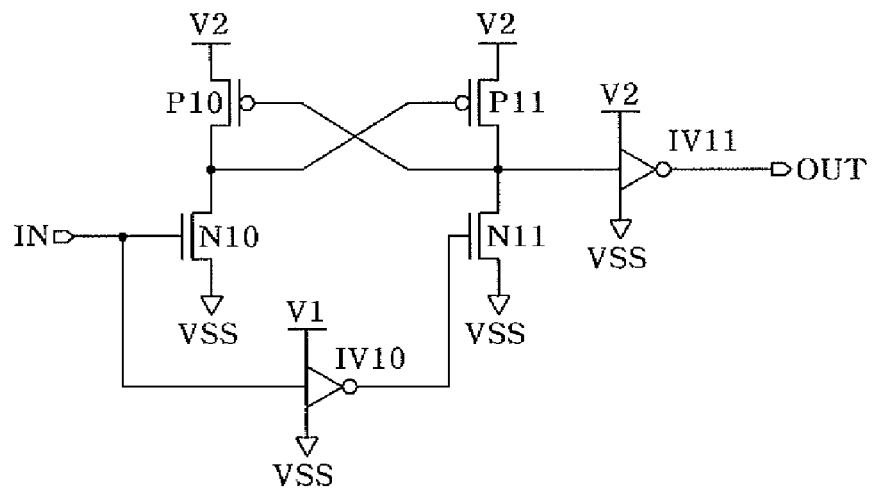
FIG. 1 is circuit diagram of a general level shifter.
Figure 2:
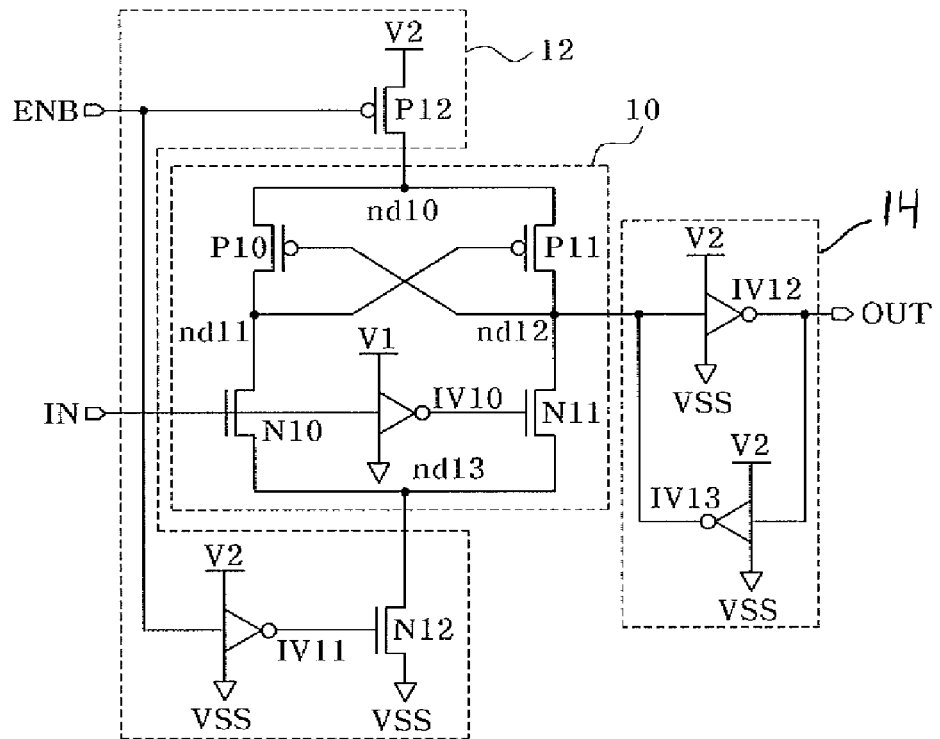
FIG. 2 is a circuit diagram of a level shifter according to an embodiment of the present invention.

FIG. 2 illustrates a circuit of a level shifter according to an embodiment of the present invention.

Referring to FIG. 2, the level shifter in this illustrative embodiment is shown comprising of a swing width transformer (or amplitude transformer) 10 receiving an input signal IN ranging between a first level V1 and the ground voltage VSS and generating a signal at a node nd12 which ranges between a second level V2 and the ground voltage VSS, a power supply controller 12 determines a power voltage supply at the second level V2 or the ground voltage VSS to the swing width transformer 10 in response to an inverted enable signal ENB that is activated in a low level state when in the active mode, and a latch 14 driven by the power voltage at the second level V2 and generating an output signal OUT by latching the signal of the node nd12.

In this illustrative embodiment, the swing width transformer 10 is shown formed of a PMOS transistor P10, a PMOS transistor P11, an NMOS transistor N10, and an NMOS transistor N11. The PMOS transistor P10 functions as a pull-up element connected between a node nd10 and a node nd11 and is turned on to pull-up the node nd11 in response to the signal of the node nd12. The PMOS transistor P11 functions as a pull-up element connected between the node nd10 and the node nd12 and is turned on to pull-up the node nd12 in response to a signal of the node nd11. The NMOS transistor N10 functions as a pull-down element connected between the node nd11 and a node nd13 and is turned on to pull-down the node nd11 in response to the input signal IN. The NMOS transistor N11 functions as a pull-down element connected between the node nd12 and the node nd13 and is turned on to pull-down the node nd12 in response to an inverted signal of the input signal IN. Here, an inverter IV10 inversely turning with respect to a logical level of the input signal IN and the inverter IV10 is driven by a power voltage at the first level V1. The NMOS transistors N10 and N11 may be preferred to be made from MOS transistors that have low threshold voltages so as to be operable in a low level of the input signal IN.

In this illustrative embodiment, the power supply controller 12 is shown formed of a PMOS transistor P12 and an NMOS transistor N12. The PMOS transistor P12 is configured to be turned on in response to the inverted enable signal ENB applied thereto with a low level state in the active mode and which supplies the power voltage at the second level V2. The NMOS transistor N12 is configured to be turned on in response to an output signal of an inverter IV11 (i.e., the inverted enable signal ENB), which is applied thereto with a high level state in the active mode, and which is connects the node nd13 to the ground voltage VSS. Here, the inverted enable signal ENB is set at the level of the ground voltage VSS in the active mode, but set at the second level V2 in the standby mode. The inverter IV11 is driven by the power voltage at the second level V2.

Now, an operation of the level shifter illustrated in FIG. 2 will be hereinafter divisionally described about the active and standby modes.

In this illustrative embodiment, in the active mode, as the inverted enable signal ENB is conditioned in a low level state, the PMOS and NMOS transistors (P12 and N12, respectively) are both turned on to respectively supply the power voltage and the ground voltage VSS to the swing width transformer 10. The swing width transformer 10 receives the input signal IN which can range between the first level V1 and the ground voltage VSS. The swing width transformer 10 then generates the signal of the node nd12 in the voltage range between the second level V2 and the ground voltage VSS.

In this illustrative embodiment, in the standby mode, as the inverted enable signal ENB is conditioned at a low level state, the PMOS and NMOS transistors (P12 and N12) are both turned off. Thus, the power voltage and the ground voltage VSS are both interrupted to the swing width transformer 10, and as a result any leakage current is blocked by the NMOS transistors N10 and N11 which are made from low-threshold MOS transistors.

Figure 3:
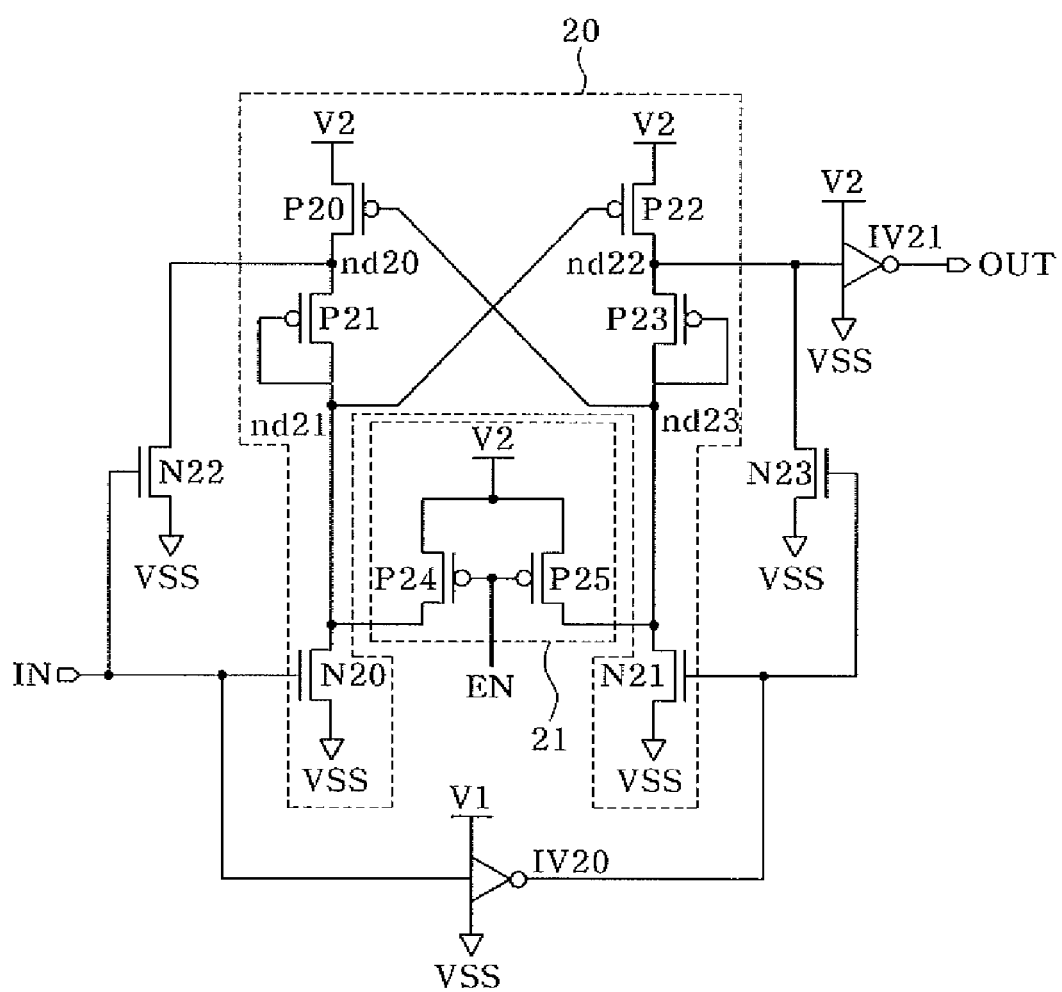
FIG. 3 is a circuit diagram of a level shifter according to another embodiment of the present invention.

FIG. 3 illustrated a circuit of a level shifter according to another embodiment of the present invention.

Referring to FIG. 3, the level shifter according to this illustrative embodiment is shown comprised of a swing width transformer 20, a voltage setter 21, an NMOS transistor N22, an NMOS transistor N23, and an inverter IV21. The swing width transformer 20 is configured to receive the input signal IN that can range between the first level V1 and the ground voltage VSS. The swing width transformer 20 is also configured to generate a signal at a node nd22 that ranges between the second level V2 and the ground voltage VSS. The voltage setter 21 is configured to set internal nodes nd21 and nd23 at the second level V2 in response to the enable signal EN when the enable signal EN is activated in a high level state during the active mode. The NMOS transistor N22 is configured to function as a pull-down element when turned on to pull-down a voltage at the node nd20 in response to the input signal IN. The NMOS transistor N23 is configured to function as a pull-down element that is turned on to pull-down the node nd22 in response to an inverted signal of the input signal IN. The inverter IV21 is configured to drive the power voltage at the second level V2 and to invert the signal at node nd22 to generate an output signal OUT.

The swing width transformer 20 is configured to have a PMOS transistor P20, a PMOS transistor P21, an NMOS transistor N20, a PMOS transistor P22, a PMOS transistor P23, and an NMOS transistor N21. The PMOS transistor P20 functions as a pull-up element and is connected between the power voltage of the second level V2 and the node nd20 which is configured to turn on to pull-up the node nd20 in response to a signal of the node nd23. The PMOS transistor P21 is configured to operate as a diode connected between the node nd20 and the node nd21. The NMOS transistor N20 is configured to function as a pull-down element connected between the node nd21 and the ground voltage VSS and is configured to be turned on to pull-down the node nd21 in response to the input signal IN. The PMOS transistor P22 is configured to function as a pull-up element connected between the power voltage of the second level V2 and the node nd22 and is configured to be turned on to pull-up the node nd22 in response to a signal of the node nd21. The PMOS transistor P23 is configured to operate as a diode connected between the node nd22 and the node nd23. The NMOS transistor N21 is configured to function as a pull-down element connected between the node nd23 and the ground voltage VSS and is configured to be turned on to pull-down the node nd23 in response to the inverted signal of the input signal IN.

The voltage setter 21 is formed of a PMOS transistor P24, and a PMOS transistor P25. The PMOS transistor P24 is configured to function as a switch element connected between the power voltage of the second level V2 and the node nd21 and is configured to be turned on to set the node nd21 to the second level V2 in response to the enable signal EN. The PMOS transistor P25 is configured to function as a switch element connected between the power voltage of the second level V2 and the node nd23 and is configured to turned on to set the node nd23 to the second level V2 in response to the enable signal EN.

Now, an operation of the level shifter illustrated in FIG. 3 will be hereinafter divisionally described about the active and standby modes.

In the active mode, i.e., when the enable signal ENB is at a high level state, the PMOS transistors P24 and P25 are all turned off. As a result, the swing width transformer 20 receives the input signal IN ranging between the first level V1 and the ground voltage VSS and generates the signal of the node nd22 in the voltage range between the second level V2 and the ground voltage VSS.

In the standby mode, i.e., when the enable signal ENB is at a low level state, the PMOS transistors P24 and N25 are all turned off. As a result, nodes nd21 and nd23 of the swing width transformer 20 are set at the second level V2, and as a result the swing width transformer 20 stops the level shifting operation. Thereby, a leakage current is curtailed, ceased or interrupted by the NMOS transistors N20 and N21 because the nodes nd21 and nd23 are held at the second level V2.

Figure 4:
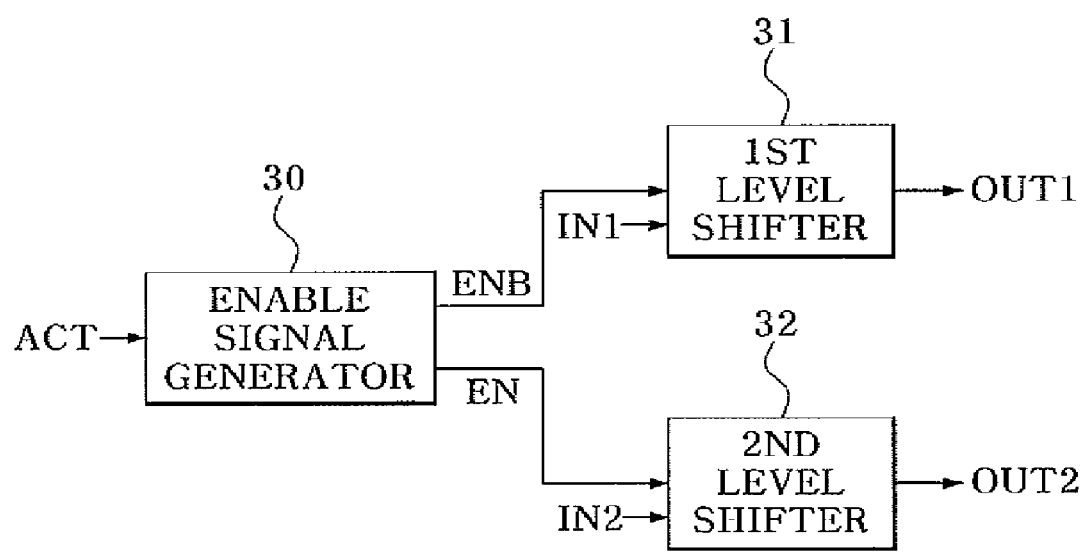
FIG. 4 is a block diagram illustrating a configuration of a semiconductor device embodied according to the present invention.

FIG. 4 illustrates a block organization of a semiconductor device embodied according to the present invention.

Referring to FIG. 4, the semiconductor device includes an enable signal generator 30, a first level shifter 31 and a second level shifter 32.

While in the active mode, the enable signal generator 30 is configured to respond to an activation state signal ACT to operate to generate the inverted enable signal ENB, which is activated in a low level state, and the enable signal EN activated in a high level state. While in the standby mode, the enables signal generator 30 is configured to respond to the activation state signal ACT to operates to generate the inverted enable signal ENB, which is inactivated in a high level state, and the enable signal EN inactivated in a low level state.

The first level shifter 31 may be implemented as that of the level shifter shown in FIG. 2. That is, the first level shifter 31 is configured to be supplied with the power voltage of the second level V2 and the ground voltage VSS in response to the inverted enable signal ENB that is activated in a low level state during the active mode, and the first level shifter 31 is configured to generate a first output signal OUT1, which ranges between the second level V2 and the ground voltage VSS, from a first input signal IN1 ranging between the first level V1 and the ground voltage VSS. In the standby mode, the first level shifter 31 is configured to interrupt the power voltage of the second level V2 and the ground voltage VSS by the inverted enable signal ENB inactivated in a high level state which thereby prevents or at least minimizes the occurrence of leakage current.

The second level shifter 32 may be implemented as that of the level shifter shown in FIG. 3. That is, the second level shifter 32 is configured to be supplied with the power voltage of the second level V2 and the ground voltage VSS in response to the enable signal EN that is activated in a high level state during the active mode, and the second level shifter 32 is configured to generate a second output signal OUT2, which ranges between the second level V2 and the ground voltage VSS, from a second input signal IN2 ranging between the first level V1 and the ground voltage VSS. In the standby mode, the second level shifter 32 sets an internal node on the second level V2 in response to the enable signal EN inactivated in a low level, preventing or at least minimizing the occurrence of leakage current as well as stopping the level shifting operation.

As described above, the level shifters according to the embodiments are set not to be driven during the standby mode in which there is no need of conducting the level shifting operation, which is hence effective in reducing or preventing the occurrence of leakage current.

While the present invention has been described with respect to the specific embodiments, it will be apparent to those skilled in the art that various changes and modifications may be made without departing from the spirit and scope of the invention as defined in the following claims.

What is claimed is:

1. A level shifter comprising:
a first pull-up element connected between a first node and a second level power voltage and configured to pull-up the first node in response to a signal of the second node;
a diode connected between the first node and a third node;
a first pull-down element connected between the third node and a ground voltage and configured to pull-down the third node in response to an input signal ranging between a first level power voltage and the ground voltage;
a second pull-up element connected between the second level power voltage and a fourth node and configured to pull-up the fourth node in response to a signal of the third node;
a second diode connected between the fourth node and the second node;
a second pull-down element connected between the second node and the ground voltage and configured to pull-down the second node in response to the input signal;
a first switching element connected between the second level power voltage and the third node and configured to be turned off during an active mode and configured to be turned on to drive the third node to a level of the second level power voltage during a standby mode, in response to the enable signal;
a second switching element connected between the second level power voltage and the second node and configured to be turned on during the active mode and configured to be turned on to drive the second node to the level of the second level power voltage during the standby mode, in response to the enable signal; and
a third pull-down element connected between the first node and the ground voltage and configured to pull-down the first node in response to the input signal; a fourth pull-down element connected between the fourth node and the ground voltage and configured to pull-down the fourth node in response to an inverted signal of the input signal; and an inverter driven by the second level power voltage and configured to generate an output signal by inverting a signal of the fourth node.

* * * * *